(12) United States Patent
Chung et al.

(10) Patent No.: US 9,169,346 B2
(45) Date of Patent: Oct. 27, 2015

(54) EPOXY RESIN VARNISHES, LAMINATES AND PRINTED CIRCUIT BOARDS

(75) Inventors: Chien-Jen Chung, Suzhou (CN); Zhuo Wang, Suzhou (CN)

(73) Assignee: Ventec Electronics (Suzhou) Company, Jiangsu (CN)

( * ) Notice: Subject to any disclaimer, the term of this patent is extended or adjusted under 35 U.S.C. 154(b) by 1445 days.

(21) Appl. No.: 12/337,651

(22) Filed: Dec. 18, 2008

(65) Prior Publication Data

US 2010/0092764 A1    Apr. 15, 2010

(30) Foreign Application Priority Data

Oct. 9, 2008    (CN) .......................... 2008 1 0107262

(51) Int. Cl.
| | |
|---|---|
| *C08G 59/30* | (2006.01) |
| *B32B 15/14* | (2006.01) |
| *B32B 27/04* | (2006.01) |
| *B32B 27/18* | (2006.01) |
| *B32B 27/38* | (2006.01) |
| *C08J 5/24* | (2006.01) |
| *C08L 63/00* | (2006.01) |
| *B32B 17/04* | (2006.01) |
| *H05K 1/03* | (2006.01) |
| *B32B 27/26* | (2006.01) |
| *B32B 17/10* | (2006.01) |
| *C08K 3/36* | (2006.01) |

(52) U.S. Cl.
CPC ............... *C08G 59/30* (2013.01); *B32B 15/14* (2013.01); *B32B 27/04* (2013.01); *B32B 27/18* (2013.01); *B32B 27/38* (2013.01); *C08J 5/24* (2013.01); *C08L 63/00* (2013.01); *H05K 1/0373* (2013.01); *B32B 17/04* (2013.01); *B32B 17/10733* (2013.01); *B32B 27/26* (2013.01); *C08G 59/308* (2013.01); *C08J 2363/00* (2013.01); *C08J 2363/02* (2013.01); *C08J 2463/02* (2013.01); *C08K 3/36* (2013.01); *C08K 2201/019* (2013.01); *C08L 2205/16* (2013.01); *C08L 2666/58* (2013.01); *H05K 1/0366* (2013.01); *H05K 2201/0209* (2013.01); *H05K 2201/0239* (2013.01); *H05K 2201/0275* (2013.01); *Y10T 428/259* (2015.01); *Y10T 428/2971* (2015.01); *Y10T 428/31529* (2015.04)

(58) Field of Classification Search
CPC .. B32B 17/04; B32B 17/10733; B32B 27/26; B32B 27/38; C08G 59/308; C08J 5/24; C08J 2363/02; C08J 2463/02; C08K 3/36; C08K 2201/019; C08L 63/00; C08L 2205/16; C08L 2666/58; H05K 1/0366; H05K 1/0373; H05K 2201/0209
See application file for complete search history.

(56) References Cited

U.S. PATENT DOCUMENTS

| | | |
|---|---|---|
| 5,670,250 A | 9/1997 | Sanville, Jr. et al. |
| 6,187,852 B1 | 2/2001 | Tungare et al. |
| 6,322,885 B2 | 11/2001 | Tungare et al. |
| 6,509,414 B2 | 1/2003 | Tikart et al. |
| 7,090,724 B2 | 8/2006 | Wang et al. |
| 7,425,371 B2 | 9/2008 | Sharma et al. |
| 2009/0054587 A1* | 2/2009 | Oshimi et al. ................ 524/612 |

FOREIGN PATENT DOCUMENTS

| | | | | |
|---|---|---|---|---|
| JP | 5162128 | | 6/1993 | |
| JP | 8267658 | | 10/1996 | |
| JP | 2000090742 A | * | 3/2000 | ............... H01B 3/40 |
| JP | 2006222409 A | * | 8/2006 | |
| WO | WO 2006098329 A1 | * | 9/2006 | |

* cited by examiner

*Primary Examiner* — Richard A Huhn
(74) *Attorney, Agent, or Firm* — Jones Day

(57) ABSTRACT

Provided herein are, among other things, epoxy resin varnishes and methods of making and using the same. In some embodiments, the epoxy resin varnishes comprise at least a filler such as silica. In certain embodiments, the epoxy resin varnishes provided herein are used for making laminates such as copper clad laminates. In farther embodiments, the copper clad laminates provided herein are used for making printed circuit boards (PCBs).

16 Claims, No Drawings

EPOXY RESIN VARNISHES, LAMINATES AND PRINTED CIRCUIT BOARDS

PRIOR RELATED APPLICATIONS

This application claims the benefit under 35 U.S.C. §119 (a)-(d) of Chinese Patent Application Serial Number 200810107262.2, filed Oct. 9, 2008, which is incorporated herein by reference in its entirety.

FIELD OF THE INVENTION

Provided herein are, among other things, epoxy resin varnishes and methods of making and using the same. In some embodiments, the epoxy resin varnishes comprise at least a filler such as silica. In certain embodiments, the epoxy resin varnishes provided herein are used for making laminates such as copper clad laminates. The copper clad laminates provided herein can be used to make printed circuit boards (PCBs).

BACKGROUND OF THE INVENTION

After more than half a century of development of epoxy copper clad laminate (CCL), the worldwide annual output of epoxy CCL is more than 300 million square meters. Epoxy CCL has been widely used as a reinforcement material for making epoxy printed circuit board (PCB). Epoxy CCL can generally provide desirable properties such as turn-on interconnection, insulation and support for circuits. In general, the properties of epoxy CCL can affect the signal transmission speed, energy loss, impedance, and the like of the PCB. Therefore, the performance, quality, processability, the manufacturing level, manufacturing costs, as well as long-term reliability and stability of the epoxy printed circuit board depend to a large extent on the properties of the CCL material. Whether it is a lead-free CCL, high density interconnect (HDI) CCL, integrated circuit (IC) packaging reinforcements or high-performance flexible CCL, the CCL should have a good adhesive strength, excellent insulation properties, high heat resistance and humidity resistant. In some embodiments, inorganic filler are added to varnishes comprising epoxy resins to reduce costs and improve the performance of the epoxy CCL. Choice of which have a relatively large number of talcum powder, aluminum hydroxide, silica, mica, and so on, all the materials can be in the dimensional stability of the CCL, the direction of the thickness of the expansion coefficient (Z-CTE) to achieve significant results.

When the peel strength is low, there is a possibility that circuit peeling during the manufacturing process of a printed circuit board and the falling-off of mounted parts in the outermost layer may occur and this is undesirable.

Therefore, there is a need for metal clad laminates with improved peel strength. There is also a need for metal clad laminates with improved Z-CTE.

SUMMARY OF THE INVENTION

Provided herein are epoxy resin varnishes and methods of making the epoxy resin varnishes. Also provided herein are methods of using the epoxy resin varnishes disclosed herein for making prepreg, metal clad laminates and printed circuit boards.

In one aspect, provided herein is an epoxy resin varnish comprising:
(a) an epoxy resin;
(b) a curing agent;
(c) a coupling agent;
(d) a catalyst;
(e) an inorganic filler; and
(i) a solvent,
wherein the amount of the inorganic filler is from about 5 parts to about 30 parts by weight based on 100 parts by weight of the epoxy resin.

In another aspect, provided herein is a prepreg comprising a partially cured epoxy resin composition comprising an epoxy resin, a curing agent, a coupling agent, a catalyst, and an inorganic filler, wherein the amount of the inorganic filler is from about 5 parts to about 30 parts by weight, based on 100 parts by weight of the epoxy resin.

In another aspect, provided herein is a metal clad laminate comprising: (a) a resin layer comprising a cured epoxy resin composition; and (b) a metal layer on at least one main surface of the resin layer, wherein the epoxy resin composition comprising an epoxy resin, a curing agent, a coupling agent, a catalyst, and an inorganic filler, and wherein the amount of the inorganic filler is from about 5 parts to about 30 parts by weight based on 100 parts by weight of the epoxy resin.

In another aspect, provided herein is a method of preparing an epoxy resin varnish comprising mixing an epoxy resin, a curing agent, a coupling agent, a catalyst and an inorganic filler in a solvent, wherein the amount of the inorganic filler is from about 5 parts to about 30 parts by weight based on 100 parts by weight of the epoxy resin.

In another aspect, provided herein is a method of preparing a prepreg comprising the steps of (a) impregnating one or more glass clothes with the epoxy resin varnish of claim 1; and (b) drying the impregnated one or more glass clothes at a temperature from about 100° C. to about 250° C.

In another aspect, provided herein is a method of preparing a metal laminate comprising contacting a metal foil with at least a surface of the prepreg disclosed herein; and thermo-press-bonding the metal foil to the surface of the prepreg.

In some embodiments, the inorganic filler has a water content of less than about 2 wt. % or less than about 1 wt. %. In certain embodiments, the inorganic filler is talc, silica or silicon dioxide, aluminum hydroxide, mica, kaolin, aluminum silicate, clay or a combination thereof. In other embodiments, the inorganic filler is substantially free of or free of talc, silica, aluminum hydroxide, mica, kaolin, aluminum silicate or clay. In farther embodiments, the inorganic filler is substantially free of or free of talc.

DEFINITIONS

As used herein, a composition that is "substantially free" of a compound means that the composition contains less than 20 vol. %, less than 10 vol. %, less than 5 vol. %, less than 4 vol. %, less than 3 vol. %, less than 2 vol. %, less than 1 vol. %, less than 0.5 vol. %, less than 0.1 vol. %, or less than 0.01 vol. % of the compound, based on the total volume of the composition.

In the following description, all numbers disclosed herein are approximate values, regardless whether the word "about" or "approximate" is used in connection therewith. They may vary by 1 percent, 2 percent, 5 percent, or, sometimes, 10 to 20 percent. Whenever a numerical range with a lower limit, $R^L$ and an upper limit, $R^U$, is disclosed, any number falling within the range is specifically disclosed. In particular, the following numbers within the range are specifically disclosed: $R=R^L+k*(R^U-R^L)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed.

DESCRIPTION OF EMBODIMENTS OF THE INVENTION

Provided herein is an epoxy resin varnish or an epoxy resin composition for making a laminate comprising an epoxy resin and an inorganic filler. The amount of the inorganic filler can be from about 0.5 parts to about 60 parts, from about 1 part to about 55 parts, from about 2 parts to about 50 parts, from about 3 parts to about 45 parts, from about 4 parts to about 40 parts, or from about 5 parts to about 35 parts by weight, based on 100 parts by weight of the epoxy resin. In some embodiments, the amount of the inorganic filler is from about 5 parts to about 30 parts by weight based on 100 parts by weight of the epoxy resin. In other embodiments, the amount of the inorganic filler is from about 12.5 parts to about 20 parts by weight based on 100 parts by weight of the epoxy resin.

Any epoxy resin that can be cured, polymerized or crosslinked when mixed with an epoxy curing agent or hardener can be used herein. In some embodiments, the epoxy resins are produced from a reaction between a halogen-containing epoxide such as epichlorohydrin and an aromatic diol. Some non-limiting examples of suitable halogen-containing epoxides include 1-chloro-2,3-epoxypropane (epichlorohydrin), 3-chloro-1,2-epoxybutane, 3-bromo-1,2-epoxybutane, 3-chloro-1,2-epoxyoctane and the like. Some non-limiting examples of suitable aromatic diols include 4,4'-dihydroxy-2,2-diphenylpropane (bisphenol A), bis(4-hydroxyphenyl) methane (bisphenol F), brominated bisphenol A, 4,4'-sulfonyldiphenol (bisphenol S), bisphenol AF ((CF$_3$)$_2$C(C$_6$H$_4$OH)$_2$), 2,2-bis(4-hydroxyphenyl)-butane, 4,4'-dihydroxybenzophenone, bis(4-hydroxyphenyl)-ethane, 2,2-bis(4-hydroxyphenyl)-pentane, 1,5-dihydroxynaphthalene, 4,4'-biphenol, catechol, resorcinol, hydroquinone, novolacs, and hydrogenated derivatives thereof.

In some embodiments, the epoxy resin is derived from a reaction between epichlorohydrin and bisphenol A, bisphenol F, brominated bisphenol A, bisphenol S, bisphenol AF, 4,4'-biphenol, catechol, resorcinol, hydroquinone or a combination thereof. In other embodiments, the epoxy resin is not derived from bisphenol A, bisphenol F, brominated bisphenol A, bisphenol S, bisphenol AF, or 4,4'-biphenol.

In certain embodiments, the epoxy resin is derived from a reaction between epichlorohydrin and brominated bisphenol A. In some embodiments, the epoxy resin comprises one or more diepoxy compounds having formula (I):

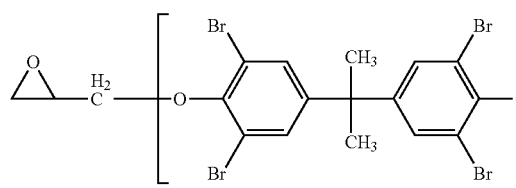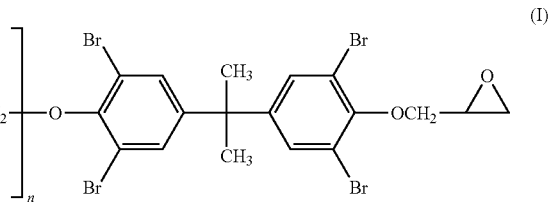

(I)

where n is an integer from 0 to about 100, from 0 to about 50, from 0 to about 25, from 0 to about 20, from 0 to about 10, from 0 to about 5, from 0 to about 4, from 0 to about 3, from 0 to about 2, or from 0 to about 1. In further embodiments, n is 0, 1, 2, 3, 4, 5, 6, 7, 8, 9 or 10. In still further embodiments, n is 0 and the diepoxy compound has formula (IA) as shown below:

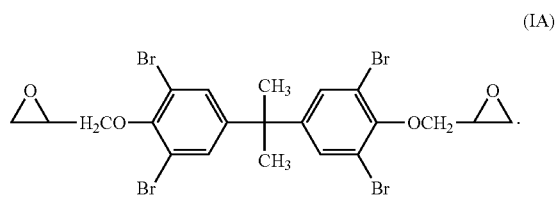

(IA)

Optionally, the epoxy resin varnish or epoxy resin composition disclosed herein comprises a curing agent. Any curing agent or hardener than cures epoxy resins can be used herein. In some embodiments, the curing agent or hardener is or comprises a phenolic hardener (e.g., phenolic novolac or resorcinol novolac), an aliphatic or cycloaliphatic amine or polyamine hardener (e.g., diethylenetriamine (DETA), triethylene-tetramine (TETA), tetraethylene-pentamine (TEPA), aminoethylpiperazine (AEP), polyethylene polyamine, polyamine epoxy adduct), an amide or polyamide hardener, dicyandiamide, bis(4,4'-diaminodiphenyl)sulfone (DDS), or a combination thereof. In certain embodiments, the curing agent or hardener is or comprises a phenolic novolac.

The amount of the curing agent can be from about 0.05 parts to about 50 parts, based on 100 parts by weight of the epoxy resin. In some embodiments, the amount of the curing agent is from about 0.1 parts to about 45 parts, from about 1 part to about 40 parts, from about 5 parts to about 35 parts, from about 10 parts to about 35 parts, or from about 15 parts to about 35 parts by weight, based on 100 parts by weight of the epoxy resin. In other embodiments, the amount of the curing agent is from about 1 parts to about 45 parts, from about 5 part to about 40 parts, from about 10 parts to about 30 parts, from about 10 parts to about 25 parts, or from about 10 parts to about 20 parts by weight, based on 100 parts by weight of the epoxy resin. In further embodiments, the amount of the curing agent is from about 15 parts to about 35 parts by weight, based on 100 parts by weight of the epoxy resin. In still further embodiments, the amount of the inorganic filler is from about 12.5 parts to about 20 parts by weight, based on 100 parts by weight of the epoxy resin.

The epoxy resin varnish or epoxy resin composition optionally comprises a coupling agent. Any coupling agent that improves adhesion of the epoxy resins disclosed herein to surfaces of the inorganic filler particles can be used herein. In some embodiments, the coupling agent is or comprises a silane coupling agent, zirconate coupling agent, titanate coupling agent, borane-based coupling agent, aluminum-based coupling agent, chromium-based coupling agent, maleic anhydride coupling agent or a combination thereof. In other embodiments, the epoxy resin varnish or epoxy resin composition disclosed herein does not comprise a coupling agent.

Any silane or titanate coupling agent known to a skilled artisan can be used herein. Some non-limiting examples of suitable silane coupling agents include: triethoxy silane; vinyl tris (β-methoxyethoxy) silane; 3-methacryloxypropyl trimethoxy silane; 3-glycidyloxypropyl trimethoxy silane; 2-(3,4-epoxycyclohexyl)ethyl trimethoxy silane; N-(2-aminoethyl)-3-aminopropyl trimethoxy silane; N-(2-aminoethyl)-3-aminopropyl methyl dimethoxy silane; 3-aminopropyl triethoxy silane; N-phenyl-3-aminopropyl trimethoxy silane; 3-mercaptopropyl trimethoxy silane; 3-chloropropyl trimethoxy silane and the like. Some non-limiting examples of suitable titanate coupling agents include: isopropyl triisostearoyl titanate; isopropyl tridecylbenzene sulfonyl titanate; isopropyl tris(dioctyl pyrophosphato) titanate; tetraisopropyl bis(dioctylphosphito) titanate; tetraoctyl bis(ditridecyl phosphito) titanate; tetra(2,2-diallyloxymethyl-1-butyl) bis(ditridecyl) phosphite titanate; bis(dioctyl pyrophosphato) oxyacetate titanate; bis(dioctyl pyrophosphato)ethylene titanate; isopropyl trioctanoyl titanate; isopropyl dimethacryl isostearoyl titanate; isopropyl isostearoyl diacryl titanate; isopropyl tri(dioctyl phosphate) titanate; isopropyl tricumylphenyl titanate; isopropyl tri(N-amidoethyl aminoethyl) titanate; dicumylphenyloxy acetate titanate; diisostearoyl ethylene titanate and the like.

In some embodiments, the coupling agent comprises 3-glycidoxypropyltrimethoxy silane having the following formula:

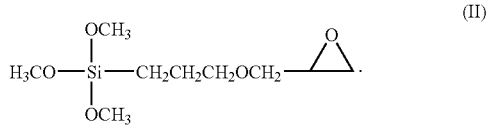

(II)

The amount of the coupling agent can be from about 0.01 parts to about 10 parts, based on 100 parts by weight of the epoxy resin. In some embodiments, the amount of the coupling agent is from about 0.02 parts to about 7.5 parts, from about 0.04 parts to about 5 parts, from about 0.06 parts to about 2 parts, from about 0.08 parts to about 1 part, or from about 0.1 parts to about 0.75 parts by weight, based on 100 parts by weight of the epoxy resin. In other embodiments, the amount of the coupling agent is from about 0.2 parts to about 0.5 parts by weight, based on 100 parts by weight of the epoxy resin.

Optionally, the epoxy resin varnish or epoxy resin composition disclosed herein comprises a catalyst. Any catalyst that accelerates the curing of epoxy resins can be used herein. Some non-limiting examples of suitable catalysts include imidazoles, imidazolium salts, tertiary amines, an reaction product of a halogenobisphenol and a tertiary amine, an adduct of an imidazole and sulfur dioxide, $BF_3$-complex and combinations thereof. In certain embodiments, the epoxy resin varnish or epoxy resin composition disclosed herein does not comprise a catalyst.

In some embodiments, the catalyst is or comprises an imidazole. Any imidazole known in the art for catalyzing the curing of epoxy resins can be used herein. Some non-limiting examples of suitable imidazole catalysts include 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, isopropylimidazole, cyanide-containing derivatives of imidazoles (e.g., 1-cynoethyl-2-methylimidazole, 1-cyanoethyl-2-undecylimidazole, 1-cyanoethyl-2-ethyl-4-methylimidazole, and 1-cyanoethyl-2-phenylimidazole), azine-containing derivatives of imidazoles (e.g., 2,4-diamino-6-[2'methylimidazolyl-(1')]-ethyl-s-triazine, 2,4-diamino-6-[2'-undecylimidazolyl-(1')]-ethyl-s-trizine, 2,4-diamino-6-[2'-ethyl-4'-methylimidazolyl-(1')]-ethyl-s-triazine, 2,4-diamino-6-vinyl-1,3,5-triazine, and 2,4-diamino-6-methaeryloyloxyethyl-1,3,5-triazine), hydroxyl-containing derivatives of imidazoles (e.g., 2-phenyl-4,5-dihydroxymethylimidazol, and 2-phenyl-4-methyl-5-hydromethylimidazole adduct), and adducts of an imidazole (e.g., 2,4-diamino-6-vinyl-1,3,5-triazine isocynauric acid, 2,4-diamino-6-methaeryloyloxyethyl-1,3,5-trizine isocynuric acid adduct, epoxy-resin imidazole adduct, 2,4-diamino-6-[2'-methyl imidazolyl-(1')]-ethyl-s-trizine isocynauric acid adduct dehydrate, and 2-phenylimidazole isocynuric acid adduct). In other embodiments, the catalyst is or comprises 2-methylimidazole.

In certain embodiments, the catalyst is or comprises an imidazolium salt. Any imidazolium salt known in the art for catalyzing the curing of epoxy resins can be used herein. Some non-limiting examples of suitable include imidazolium salt catalysts include 1-cyanoethyl-2-undecylimidazolium-trimellitate, 1-cyanoethyl-2-phenylimidazolium-trimellitate, and 1-dodecyl-2-methyl-3-benzylimidazolium chloride.

In some embodiments, the catalyst is or comprises a tertiary amine. Any tertiary amine known in the art for catalyzing the curing of epoxy resins can be used herein. Some non-limiting examples of suitable tertiary amine catalysts include benzyldimethylamine, 2,2-(dimethylaminemethyl)phenol, 2,4,6-tris(dimethylaminemethyl)phenol, triethanolamine, triethylamine, triethylenediamine and combinations thereof.

In certain embodiments, the catalyst is or comprises a reaction product of a halogenobisphenol and a catalytically active amines. Any reaction product of a halogenobisphenol and a tertiary amine known in the art for catalyzing the curing of epoxy resins can be used herein. Some non-limiting examples of suitable halogenobisphenol include chlorinated, brominated, iodinated, or fluorinated bisphenol A, bisphenol B, bisphenol F, 4,4'-dihydroxydiphenyl or 4,4'-dihydrorxydiphenylsulfone. Some non-limiting examples of suitable catalytically active amines include the tertiary amines disclosed here, the imidazoles disclosed here and combinations thereof.

The amount of the catalyst can be from about 0.001 parts to about 5 parts, based on 100 parts by weight of the epoxy resin. In some embodiments, the amount of the catalyst is from about 0.002 parts to about 1 part, from about 0.003 parts to about 0.5 parts, from about 0.004 parts to about 0.1 parts, or from about 0.005 parts to about 0.05 part by weight, based on 100 parts by weight of the epoxy resin. In other embodiments, the amount of the catalyst is from about 0.005 parts to about 0.01 parts by weight, based on 100 parts by weight of the epoxy resin.

Optionally, the epoxy resin varnish or epoxy resin composition disclosed herein comprises a solvent. Any solvent that dissolves epoxy resins can be used herein. Some non-limiting examples of suitable solvents include ethylene glycol, a glycol ether, acetonitrile, ethyl acetate, acetone, methyl ethyl ketone, diethyl ether, tetrahydrofuran, dichloromethane, chloroform, N-methylpyrrolidinone, dimethyl formamide, dimethyl sulfoxide and combinations thereof. In some embodiments, the solvent is ethylene glycol. In other embodiments, the solvent is a glycol ether, In further embodiments, the solvent is a DOWANOL™ glycol ether commercially available from the Dow Chemical Company, Midland, Mich. In other embodiments, the epoxy resin varnish or epoxy resin composition disclosed herein does not comprise a solvent.

The amount of the solvent can be from about 0 part to about 100 parts, from about 1 part to about 80 parts, from about 2 parts to about 70 parts, from about 3 parts to about 60 parts, from about 4 parts to about 50 parts or from about 5 parts to about 40 parts by weight, based on 100 parts by weight of the epoxy resin. In some embodiments, the amount of the solvent is from about 10 parts to about 30 parts by weight, based on 100 parts by weight of the epoxy resin.

The fillers used herein can provide prepregs and metal clad laminates having desirable properties such as good heat and humidity resistance, and improved insulation and mechanical properties. In some embodiments, the inorganic filler is talc, silica, aluminum hydroxide, mica, kaolin, aluminum silicate, clay, glass powder, glass microspheres, ballotini, alumina, silicon carbide, lime, bauxite, gypsum, calcium carbonate, barium sulfate, carbon black or graphite, flyash, cement dust, feldspar, nepheline, magnesium oxide, magnesium hydroxide, glass fibers, nano-clays, zinc oxide, calcium silicate, titanium dioxide, titanates, chalk or a combination thereof.

In certain embodiments, the inorganic filler is an ignition resistance filler selected from antimony oxide, decabromobiphenyl oxide, alumina trihydrate, magnesium hydroxide, borates, halogenated compounds and combinations thereof. In other embodiments, the inorganic filler is selected from glass fibers, synthetic fibers (e.g., polyolefin fibers), carbon fibers and combinations thereof.

In some embodiments, the inorganic filler is talc, silica or silicon dioxide, aluminum hydroxide, mica, kaolin, aluminum silicate, clay or a combination thereof. In other embodiments, the inorganic filler is substantially free of or free of talc, silica, aluminum hydroxide, mica, kaolin, aluminum silicate or clay. In further embodiments, the inorganic filler is substantially free of or free of talc.

In certain embodiments, the inorganic filler is a silica. In other embodiments, the silica is a crystalline silica, fumed silica, fused silica, amorphous silica (e.g., silica gel), hydrated silica or a combination thereof. In further embodiments, the silica is substantially free of or free of crystalline silica, fumed silica, fused silica, amorphous silica, or hydrated silica. In certain embodiments, the inorganic filler is a crystalline silica. Some non-limiting examples of suitable crystalline silica include α-quartz, β-quartz, β-tridymite, β-cristobalite, α-tridymite, α-cristobalite, β-cristobalite, keatite, coesite, stishovite, melanophlogite, and fibrous silica. The silica can be in any suitable physical form or shape such as ultra-fine powder, solid microspheres, hallow microspheres, flakes, disks, cylinders, hemispheres and the like. In further embodiments, the inorganic filler is substantially free of or free of hallow silica microspheres or solid silica microspheres. The silica disclosed herein can be further passivated or activated by surface-treating respectively with a surface inert or active agent such as silanes or surfactants.

The silica used herein can be classified as common silica, electrical-grade silica, electronic-grade silica, and active silica. In general, electrical-grade silica can be manufactured from high-quality quartz as raw material by special processes. They generally have a high silicon dioxide content, low ion content and low electric conductivity. In some embodiments, the inorganic filler used herein comprises electrical-grade silica micropowder. In some embodiments, the inorganic filler used herein comprises ultra-fine silica powder having an average particle size from about 0.5 microns to about 20 microns. In further embodiments, the silica is substantially free of or free of common silica, electrical-grade silica, electronic-grade silica, or active silica.

The amount of the silica disclosed herein can be from about 0.5 parts to about 60 parts, from about 1 part to about 55 parts, from about 2 parts to about 50 parts, from about 3 parts to about 45 parts, from about 4 parts to about 40 parts, or from about 5 parts to about 35 parts by weight, based on 100 parts by weight of the epoxy resin. In some embodiments, the amount of the silica is from about 5 parts to about 30 parts by weight based on 100 parts by weight of the epoxy resin. In other embodiments, the amount of the silica is from about 12.5 parts to about 20 parts by weight based on 100 parts by weight of the epoxy resin.

When used as a filler in the epoxy resin varnishes, epoxy resin compositions, prepregs or metal clad laminates disclosed herein, the inorganic filler (e.g., silica) has a water content of less than about 0.01%, less than about 0.1%, less than about 0.2%, less than about 0.3%, less than about 0.4%, less than about 0.5%, less than about 0.6%, less than about 0.7%, less than about 0.8%, less than about 0.9%, less than about 1%, less than about 1.5%, less than about 2%, less than about 2.5%, less than about 3%, or less than about 5% by weight. In some embodiments, the water content of the inorganic filler is less than about 2% by weight.

Generally, the water content of an inorganic filler is the quantity of water contained on the surface and in the pores of the inorganic filler. Any known method of measuring water content of solids can be used herein to measure the water content of the inorganic filler. For example, the water content can be measured directly measured using a known mass of a sample of the inorganic filler and a drying oven. The masses of the sample before and after drying in the oven are measured and the water content can be calculated from the masses. Alternatively, the water content of the inorganic filler can be measured by using Karl Fischer titration. Alternatively, the water content of the inorganic filler can be measured according to ASTM C 566, which is incorporated herein by reference.

When used as a filler, the silica has a purity of greater than about 99.5%, greater than about 95%, greater than about 96%, greater than about 97%, greater than about 98%, greater than about 99%, greater than about 99.1%, greater than about 99.3%, greater than about 99.5%, greater than about 99.7%, or greater than about 99.9%. In some embodiments, the silica has a purity of greater than about 99.5%.

The average particle size of the inorganic filler (e.g., silica) can be from about 0.05 microns to about 100 microns, from about 0.1 microns to about 50 microns, from about 0.2 microns to about 40 microns, from about 0.3 microns to about 30 microns, from about 0.4 microns to about 25 microns. In some embodiments, the inorganic filler has an average particle size from about 0.5 microns to about 20 microns. In other embodiments, the inorganic filler has an average particle size of at most about 5 microns, at most about 10 microns, at most about 20 microns, at most about 30 microns, or at most about 40 microns. In further embodiments, the inorganic filler has an average particle size of at least about 0.01 microns, at least about 0.05 microns, at least about 0.1 microns, at least about 0.2 microns, at least about 0.3 microns, at least about 0.4 microns, at least about 0.5 microns, at least about 0.75 microns, or at least about 1 micron.

The average particle size and the particle size distribution of the inorganic filler can be measured with any particle size analyzer known to a skilled artisan. As used or claimed herein, the average particle size and the particle size distribution data are or should be measured by a LS-POP (VI) laser particle size analyzer commercially obtained from Zhuhai Omec Technology Co., Ltd., Zhuhai, China. The LS-POP (VI) laser particle size analyzer is based on light scattering and can measure particle size in the Range from 0.2 microns to 500 microns. Alternatively, the average particle size and the particle size distribution of the inorganic filler can be measured by an equivalent instrument or method that produces essentially the same results obtained by the LS-POP (VI) laser particle size analyzer.

The surface area of the inorganic filler can be determined by the BET (Brunauer-Emmet-Teller) method of measuring surface area, as described by S. Brunauer, P. H. Emmett, and E. Teller, Journal of the American Chemical Society, 60, 309 (1938), which is incorporated herein by reference. As used or claimed herein, the surface area data are or should be calculated from the nitrogen or argon adsorption isotherm data at 77° K. utilizing the BET method. The inorganic filler can have a surface area from about 1 $m^2/g$ to about 100 $m^2/g$, from about 5 $m^2/g$ to about 75 $m^2/g$, from about 10 $m^2/g$ to about 50 $m^2/g$, or from about 15 $m^2/g$ to about 30 $m^2/g$. In some embodiments, the inorganic filler has a surface area greater than 20 $m^2/g$, greater than about 40 $m^2/g$, or greater than about 60 $m^2/g$. In other embodiments, the inorganic filler has a surface area less than 20 $m^2/g$, less than 15 $m^2/g$, or less than about 10 $m^2/g$.

In some embodiments, the inorganic filler is a silica having a water content of less than about 2%, a purity of greater than about 99.5% and an average particle size from about 0.05 microns to about 20 microns; and wherein the amount of the silica is from about 12.5 parts to about 20 parts by weight, based on 100 parts by weight of the epoxy resin. In further embodiments, the silica is an ultra-fine silica. In still further embodiments, the silica comprises silica microspheres. In still further embodiments, the silica is a crystalline silica, fumed silica, filsed silica, amorphous silica (e.g., silica gel), hydrated silica or a combination thereof.

The epoxy resin varnish or epoxy resin composition disclosed herein can be prepared by mixing an epoxy resin, a curing agent, a coupling agent, a catalyst and an inorganic filler in a solvent. In some embodiments, the amount of the inorganic filler is from about 5 parts to about 30 parts by weight based on 100 parts by weight of the epoxy resin. In certain embodiments, the method of making epoxy resin varnish or epoxy resin composition comprises (1) adding an epoxy resin to a container or reactor equipped with a mixer or stirrer; (2) adding one or more inorganic fillers (e.g., silica and talc) to the container; (3) adding one or more curing agents (e.g., phenolic novolac) to the container; (4) adding one or more solvents to the container; (5) mixing or stirring the mixture; and (6) adding other ingredients such as one or more coupling agents and/or catalysts. These steps (1)-(6) may be practiced in any sequence or order. In some embodiments, steps (5) and (6) are reversed. In other embodiments, steps (1)-(4) can be practiced in any sequence or order. In further embodiments, steps (5) and (6) are reversed and steps (1)-(4) and (6) can be practiced in any sequence or order. In still further embodiments, epoxy resin varnish or epoxy resin composition disclosed herein is pumped to treating area to prepare prepregs.

The epoxy resin varnishes and epoxy resin compositions disclosed herein can be used to prepare prepregs, metal clad laminates and printed circuit boards. In some embodiments, the prepregs comprise a partially cured epoxy resin composition comprising an epoxy resin, a curing agent, a coupling agent, a catalyst, and an inorganic filler, wherein the amount of the inorganic filler is from about 5 parts to about 30 parts by weight, based on 100 parts by weight of the epoxy resin. In some embodiments, the prepregs farther comprises a reinforcement embedded in the partially cured epoxy resin composition. In some embodiments, the inorganic filler is substantially free of or free of talc.

The prepreg can be prepared by any method known to a skilled artisan. In some embodiments, the prepreg is prepared by impregnating a reinforcement (e.g., glass clothes) with the epoxy resin varnish disclosed herein; and drying the impregnated reinforcement at a temperature from about 80° C. to about 300° C.; from about 100° C. to about 250° C., from about 120° C. to about 225° C. or from about 80° C. to about 200° C. The drying time can be from about 1 minute to about 180 minutes, from about 2 minutes to about 120 minutes, from about 3 minutes to about 60 minutes, or from about 5 minutes to about 30 minutes, depending on the drying temperature. In other embodiments, the prepregs are prepared by impregnating the epoxy resin varnish disclosed herein into at least one reinforcement and then heat-drying the impregnated reinforcement to remove the solvent and partially curing the epoxy resins in the reinforcements.

Any reinforcement suitable for preparing prepreg can be used herein. In some embodiments, the reinforcement is woven or nonwoven clothes of organic or glass fibers. In other embodiments, the reinforcement comprises one or more glass clothes. In further embodiments, the glass clothes are epoxy glass fiber clothes. In still further embodiments, the reinforcement is an E-glass cloth in 16.3 g, 48 g, 210 g or 258 g fiber weights. In still further embodiments, the reinforcement is an NE-type glass cloth. The NE-type glass cloth is a glass cloth having a low dielectric constant. In general, NE-glass cloths have a lower dielectric constant than those of the ordinary E-glass clothes.

The amount of the epoxy resin in the prepreg is from about 1 wt. % to about 90 wt. %, from about 5 wt. % to about 80 wt. %, from about 10 wt. % to about 70 wt. %, or from about 15 wt. % to about 60 wt. %, based on the total weight of the prepreg. In some embodiments, the amount of the epoxy resin in the prepreg is at least 15 wt. %, at least 25 wt. %, at least 35 wt. %, at least 45 wt. %, or at least 50 wt. %. In other embodiments, the amount of the epoxy resin in the prepreg is at most 90 wt. %, at most 80 wt. %, at most 70 wt. %, at most 60 wt. %, or at most 50 wt. %. In addition, the condition for heating the reinforcements impregnated with the varnish is, for example, 80 to 150° C. for 1 to 10 minutes, but is not restricted thereto.

Metal clad laminates may be produced using the prepregs disclosed herein by any method known to a skilled artisan. In other embodiments, the metal clad laminate having a metal foil on one side or two metal foils on both faces can be prepared by contacting a metal foil with at least a surface of the prepreg disclosed herein; and heat-pressing or thermo-pressing or thermopress-bonding the metal foil to the surface of the prepreg. In some embodiments, the metal is gold, silver, aluminum or copper. Laminates without metal such as copper may be produced using the prepregs disclosed herein by any method known to a skilled artisan.

In some embodiments, the metal of the metal clad laminates is copper. The copper foils for production of copper clad laminates may have a surface roughness from 0 micron to about 5 microns, from 0.05 microns to about 4 microns, from 0.1 microns to about 3 microns, or from 0.15 microns to about 2 microns.

The copper surface contacting with the prepreg may be surface-treated to prevent corrosion and/or improve adhesiveness with the surface of the prepreg. In certain embodiments, the copper surface may be treated with zinc or a zinc alloy. For the treatment of copper foils with zinc or a zinc alloy, zinc or the zinc alloy may be deposited onto the surface of the copper foil by means of, for example, plating. In other embodiments, the copper surface may be treated with a coupling agent such as a vinyl group-containing silane coupling agent.

In some embodiments, the metal clad laminate comprises a resin layer comprising a cured epoxy resin composition; and a metal layer on at least one main surface of the resin layer, wherein the epoxy resin composition comprising an epoxy resin, a curing agent, a coupling agent, a catalyst, and an inorganic filler, and wherein the amount of the inorganic filler is from about 5 parts to about 30 parts by weight based on 100 parts by weight of the epoxy resin. In some embodiments, the inorganic filler is substantially free of or free of talc.

The metal layer disclosed herein can be formed on the resin layer by any known method such as electroplating, sputtering, evaporation, atomic layer deposition, laminating with a metal foil, and screen printing or ink jet printing with an ink comprising nano-metal particles.

In other embodiments, the metal clad laminate is a double-sided copper clad laminate having a copper layer on each of the two main surfaces of the resin layer.

In some embodiments, the inorganic filler in the metal clad laminate is talc, silica, aluminum hydroxide, mica, kaolin, aluminum silicate, clay or a combination thereof. In some embodiments, the inorganic filler in the metal clad laminate is a silica having a water content of less than about 2%, a purity of greater than about 99.5% and an average particle size from about 0.05 microns to about 20 microns; and wherein the amount of the silica is from about 12.5 parts to about 20 parts by weight, based on 100 parts by weight of the epoxy resin.

The single-side or double-side copper clad laminates can be manufactured by a process in which an electrodeposited or rolled copper foil is superposed on one surface of the prepregs, or such prepregs are sandwiched between two such copper foils, and the resulting assembly is lamination molded. In certain embodiments, multilayered printed circuit boards having an inner-layer printed circuit are manufactured by a process in which the above copper clad laminate is combined with an inner-layer board having formed thereon a printed circuit for inner layer use and further with prepregs and either a copper foil or a single-side copper clad laminate and the resulting assembly is subjected to lamination molding to give a multilayered board both sides of which are constituted by a copper foil, and this multilayered board is subjected to processing steps such as steps for forming through-holes, outer-layer printed circuits, and the like. In some embodiments, multilayered metal clad laminates having a metal foil on one side or two metal foils on both faces can be produced by (1) stacking one or more prepregs disclosed herein; (2) placing on one or both sides metal foils such as copper foil or the like; and (3) heat-pressing or thermo-pressing or thermo-press-bonding the resulting stack.

Printed circuit boards can be prepared from the metal clad laminates disclosed herein by etching the metal foils to form a circuit pattern on the metal layer of the metal clad laminates. In some embodiments, the metal is copper. In other embodiments, multilayer printed circuit boards can be prepared by using this printed circuit boards as internal layer printed circuit boards, providing a surface treatment to the metal foils thereon, stacking multiple sheets thereof while interposing a prepreg disclosed herein between them, laying metal foils on the utmost faces of the stack, and heat-pressing the resulting entire stack. The heat-pressing condition may vary according to the formulation of the epoxy resin composition disclosed herein. In certain embodiments, these stacks are heat-pressed under a condition of a temperature in the range of 170° C. to 230° C. and a pressure from about 1.0 MPa to about 6.0 MPa (about 10 kg/cm$^2$ to about 60 kg/cm$^2$) for a suitable period. The metal clad laminates and printed circuit boards obtained in this manner have improved pro cessability, water resistance, humidity resistance, moisture and heat resistance, electrical resistivity and dimension stability.

The peel strength of the metal clad laminates disclosed herein can be measured according to IPC-TM-650 2.4.8, which is incorporated herein by reference. In some embodiments, the peel strength of the metal clad laminates is at least about 6 lb/in or at least about 6.5 lb/in for 1 oz copper foil. In other embodiments, the peel strength is at least about 7 lb/in, at least about 7.5 lb/in, at least about 8 lb/in, at least about 8.5 lb/in, at least about 9 lb/in, or at least about 9.5 lb/in for 1 oz copper foil. In further embodiments, the peel strength is at least about 10 lb/in, at least about 10.5 lb/in, at least about 11 lb/in, or at least about 11.5 lb/in, at least about 12 lb/in for 1 oz copper foil.

The dimension stability or change of the laminates disclosed herein can be measured by any known method such as thermomechanical analysis. The dimension stability and linear, area or volumetric coefficients of thermal expansion of the prepregs and laminates disclosed herein can be improved by the inorganic filler disclosed herein. In some embodiments, the linear coefficient of thermal expansion in the thickness direction (Z-CTE) of the laminate is less than 100 ppm/° C., less than 90 ppm/° C., less than 80 ppm/° C., less than 70 ppm/° C., or less than 60 ppm/° C. before the glass transition temperature (Tg) of the laminates. In other embodiments, the Z-CTE of the laminate is less than 400 ppm/° C., less than 300 ppm/° C., less than 250 ppm/° C., less than 240 ppm/° C., less than 230 ppm/° C., less than 220 ppm/° C., or less than 210 ppm/° C. after Tg. In further embodiments, the volumetric coefficient of thermal expansion of the prepreg or laminate is in the range from about $1 \times 10^{-4}$/K to about $1 \times 10^{-7}$/K, from about $5 \times 10^{-5}$/K to about $2 \times 10^{-7}$/K, from about $4 \times 10^{-5}$/K to about $3 \times 10^{-7}$/K, or from about $3 \times 10^{-5}$/K to about $4 \times 10^{-7}$/K at 20° C.

The volume and surface resistivities of the laminates disclosed herein can be measured according to IPC-TM-650 2.5.17.1, which is incorporated herein by reference. The resistivities of the laminates disclosed herein can be improved by the inorganic filler disclosed herein. In some embodiments, the volume resistivity of the laminate is in the range from about $1 \times 10^3$ MΩ-cm to about $1 \times 10^7$ MΩ-cm, from about $1 \times 10^3$ MΩ-cm to about $1 \times 10^6$ MΩ-cm, from about $1 \times 10^3$ MΩ-cm to about $1 \times 10^5$ MΩ-cm, or from about $1 \times 10^3$ MΩ-cm to about $1 \times 10^4$ MΩ-cm. In other embodiments, the surface resistivity of the laminates disclosed herein can be in the range from about $1 \times 10^3$ MΩ to about $1 \times 10^6$ MΩ, from about $1 \times 10^3$ MΩ to about $1 \times 10^5$ MΩ, or from about $1 \times 10^3$ MΩ to about $1 \times 10^4$ MΩ.

The water absorption of the laminates disclosed herein can be measured according to IPC-TM-650 2.6.2.1, which is incorporated herein by reference. In some embodiments, the water absorption of the laminate is less than about 2%, less than about 1.75%, less than about 1.5%, less than about 1.2%, less than about 1%, less than about 0.9%, less than about 0.8%, less than about 0.7%, less than about 0.5%, less than about 0.4%, less than about 0.3%, less than about 0.2%, less than about 0.19%, less than about 0.18%, less than about 0.17%, less than about 0.16%, or less than about 0.15%.

The dielectric constant and dissipation factor of the metal clad laminates disclosed herein can be measured according to IPC-TM-650 2.5.5.2, which is incorporated herein by reference. In some embodiments, the dielectric constant of the prepreg or laminate is less than about 5.4, less than about 5, less than about 4.75, less than about 4.5, or less than about 4, measured at 250 MHz.

The thermal decomposition temperature of the laminates disclosed herein can be measured according to IPC-TM-650 2.4.24.6, which is incorporated herein by reference. In some embodiments, the thermal decomposition temperature of the laminate is at least about 290° C., at least about 310° C., at least about 325° C., or at least about 340° C.

The tensile strength, elongation and Young's modulus of the laminates disclosed herein can be measured according to IPC-TM-650 2.4.18.3, which is incorporated herein by reference. In some embodiments, the Young's modulus of the laminate is at least about 16 GPa, at least about 17 GPa, at least about 18 GPa, at least about 19 GPa, at least about 20 GPa, at least about 21 GPa, at least about 22 GPa, at least about 23 GPa, at least about 24 GPa, or at least about 25 GPa.

The thermal stress of the laminates disclosed herein can be measured according to IPC-TM-650 2.4.13.1, which is incorporated herein by reference. In some embodiments, the thermal stress of the laminate is at least about 1 time, at least about 5 times, at least about 10 times, at least about 15 times, at least about 20 times, at least about 25 times, or at least about 30 times, measured at 288° C. in 10 seconds.

The flammability of the laminates disclosed herein can be measured according to UL 94, which is incorporated herein by reference.

EXAMPLES

In the following examples, efforts have been made to ensure accuracy with respect to numbers used (for example, amounts, temperature, and so on), but variation and deviation can be accommodated, and in the event a clerical error in the numbers reported herein exists, one of ordinary skill in the arts to which this invention pertains can deduce the correct amount in view of the remaining disclosure herein. All reagents, unless otherwise indicated, were obtained commercially. The following examples are intended for illustrative purposes only and do not limit in any way the scope of the present invention.

The general formulation of some of the epoxy resin varnishes disclosed herein is shown in Table 1.

TABLE 1

| Ingredients | Supplier | Amount |
|---|---|---|
| Epoxy resin (solid) | XU 19074 was obtained from the Dow Chemical Company, Midland, MI. | 100 g |
| Phenolic novolac | KPH-L2003 was obtained from Kolon GP Chemical(SuZhou) Co., Ltd, Suzhou, China. | 15 g-35 g |
| Filler | Any filler disclosed herein. | 0 g-30 g |
| Coupling agent | Dow Corning Z-6040 silane was obtained from the Dow Corning Corporation, Midland, MI. | 0.2 g-0.5 g |
| Catalyst | 2MZ (i.e., 2-methyl imidazole) was obtained from Shikoku OM (Shanghai) Co., Ltd., Shanghai, China. | 0.05 g-0.1 g |
| Solvent | PM glycol ether was obtained from the Dow Chemical Company, Midland, MI. | 10 g-30 g |

The general procedure of making a copper clad laminate is as follows. The first step of making the laminate is the preparation of the epoxy resin varnish. At about 35° C., the epoxy resin, curing agent, coupling agent, catalyst, solvent and inorganic filler were added into a container and the mixture was mixed to form the epoxy resin varnish.

The second step of making the copper clad laminate was impregnation. A glass cloth was impregnated and heated in an oven temperature at about 150° C. to about 250° C. until it has become a prepreg. The line speed of the prepreg making machine for making the prepreg was from about 6 m/minute to about 12 m/minute. The gel time was from about 60 minutes to about 90 minutes. The resin content was from about 40% to about 80%. The resin flow was from about 20% to about 50%. The volatile content was lower than about 0.75%.

The third step of making the copper clad laminate was hot pressing. After the prepreg was cut into the required size, the prepreg was laminated with a copper foil. Hot pressing was performed on the laminate to form a copper clad laminate. The conditions of the hot pressing step were set at a vacuum of 40 torr at a press pressure from about 20 kg/cm$^2$ to about 35 kg/cm$^2$. The hot press was set at a temperature from about 50° C. to about 240° C. and the temperature ramping rate was from about 1.0° C./minute to about 3.0° C./minute. The curing time was from about 45 minutes to about 90 minutes and the press time was from about 120 minutes to about 240 minutes.

Testing Procedures of Copper Clad Laminates

Peel Strength

The peel strength of the copper clad laminates prepared herein was measured according to IPC-TM-650 2.4.8. Apparatus and chemicals required for the peel strength test include a tensile tester equipped with a load cell, capable of measuring to the nearest 0.0045 kg, a solder pot, a specimen hold-down clamping system, organic chemical stripper (e.g., methylene chloride), sodium hydroxide 10 g/liter, boric acid 30 g/liter, sulfuric acid 10 g/liter, organic degreaser (e.g., isopropyl alcohol), hot fluid bath, Dow Silicone Fluid no. 704 and Dow Silicone Grease.

Specimens of the copper clad laminates were cut into 3.18 mm test strips. A minimum of two test strips per specimen were peeled. For testing peel strength of materials as received, the specimen was fasten down and an unencumbered vertical pull was exerted. Force was applied in the vertical direction at the rate of about 50.8 mm/minute until at least a 25.4 mm peel was completed. For testing peel strength after thermal stress, a thin coating of silicon grease was applied to the specimen and float on solder pot maintained at about 288° C. for about 10 seconds.

Evaluation of the specimen was performed by normal or corrected 20/20 vision to record loss of surface resin, discoloration, resin softening, delamination, blistering, propagation of imperfections, measling, crazing, or voids. The peel strength was calculated as per the formula: peel strength (in lbs/in)=$L_M/W_S$, where $L_M$ was the minimum load and $W_S$ was measured width of the peel strip.

Thermal Decomposition

The thermal decomposition of the copper clad laminates prepared herein was measured according to IPC-TM-650 2.4.24.6. The thermogravimetry analyzer (TGA) was equipped with a null type microbalance, sensitive to 0.001 mg, a furnace equipped with dry nitrogen purge and a temperature programmer capable of providing controlled about 10° C. per minute heating rate from ambient to about 550° C. The gas purge was generally ran for 30 minutes before inserting a sample and the instrument was calibrated with the same flow rate as used during the test.

During the test, a sample was weighed (from about 10 mg to about 30 mg) and placed in the TGA. The sample was heated at a rate of 10° C./minute from <50° C. to about 550° C. $T_d(2\%)$ data were taken when the sample was 2.0% less than its mass measured at 50° C. $T_d(5\%)$ data were taken when the sample was 5.0% less than its mass measured at 50° C.

Tensile Strength, Elongation and Modulus

The tensile strength, elongation and modulus of the copper clad laminates prepared herein were measured according to IPC-TM 650 2.4.18.3. The testing machine was equipped with a load cell and a device for recording tensile load. Gripping devices were used to avoid slippage and uneven stress distribution.

The test specimen was a strip of about 12.70 mm wide by 76.20 mm long and about 10 µm in thickness. The test was conducted at about 23° C. and about 50% relative humidity. The test specimen was measured to an accuracy of 0.1 µm at about 5 different places within the gauge length area, and the initial gauge length was set at 25.4 mm and the rate of grip separation at 5.08 mm/minute. The mean and standard deviation for tensile strength, elongation and modulus in each specimen were calculated according to IPC-TM 650 2.4.18.3 and used to determine the final result.

Volume and Surface Resistivities

The volume and surface resistivities of the copper clad laminates prepared herein were measured according to IPC-TM-650 2.5.17.1. When the thickness of the laminate was 0.51 mm or greater, three specimens of dimensions about 101.6 mm×101.6 mm by the thickness were prepared for each test condition. When the thickness of the laminate was less than 0.51 mm, three specimens of dimensions about 50.8 mm×50.8 mm by the thickness were prepared for each test condition. All samples were photoprinted with a pattern of the outlines of the conductors and etched in accordance with IPC-TM-650 methods attached with electrodes. For laminates thicker than 0.51 mm, the electrodes were applied using silver conductive paint. Specimens of a thickness less than 0.51 mm were conditioned by subjecting to about 90% relative humidity and about 35° C. for a period of about 96 hours prior to electrical measurement. Specimens of a thickness greater than, or equal to, 0.51 mm were conditioned by subjecting to the conditioning specified in IPC-TM-650 2.6.3. For elevated temperature conditioning, specimens shall be subjected to about 125° C. for a period of about 24 hours. All electrical measurements were taken inside the applicable conditioning chamber completed within the 2 hour tolerance of the conditioning after achieving 1.5 hours steady state of about 25° C. and about 90% relative humidity. All electrical measurements were made using 500 volts direct current applied for about 60 seconds prior to taking the actual reading for stabilization purposes. The measurement of the volume resistance was by connecting the resistance measuring device to the specimen electrodes through the fixture system. The measurement of the surface resistance was by interchanging the test cables connecting the solid back electrode and the outer ring to the instrument for the arrangement shown in FIG. 3 of IPC-TM-650 2.5.17.1. The surface and volume resistivities were calculated according to IPC-TM-650 2.5.17.1.

Water Absorption

The water absorption of the copper clad laminates prepared herein was measured according to IPC-TM-650 2.6.2.1. Three test specimens were prepared to about 2.0 inches long by 2.0 inches wide by the thickness of the material with edges milled or sand smoothed with 400 grit. The metal cladding was removed by etching per IPC-TM-650, Methods 2.3.6, 2.3.7 or 2.3.7.1. The apparatus required was a circulating air oven capable of maintaining a uniform temperature of about 105° to 110° C. and a desiccator capable of maintaining less than 20% R.H. at about 21° C.

The specimens were conditioned by the drying oven for 1 hour, cooled to room temperature in a desiccator and weighed immediately. The specimens were immersed in a container of distilled water maintained at about 23° C. for about 24 hours to 24 hours and 3 0 minutes. The specimens were then cloth dried and weighed immediately. The water absorption was the percentage increase in weight for each specimen calculated according to IPC-TM-650 2.6.2.1.

Dielectric Constant and Dissipation Factor

The dielectric constant and dissipation factor of the copper clad laminates prepared herein were according to IPC-TM-650 2.5.5.2. Each specimen was about 50.8 mm in diameter by thickness of laminate or reinforcement material. Both sides of the specimens were coated with one uniform coating of silver conductive paint. The specimens were air dried until dry to touch and oven-dried at about 50° C. and cool in a desiccator. A 25.4 mm diameter disc was punched or machined into the specimens which were conditioned for a minimum of 40 hours at about 23° C. at relative humidity of about 50%. The specimen was placed onto the meter and the dissipation factor was read on the display. The dielectric constant was calculated according to IPC-TM-650 2.5.5.2.

Permittivity and Loss Tangent

The permittivity and loss tangent of the copper clad laminates prepared herein were measured according to IPC-TM-650 2.5.5.3, which is incorporated herein by reference. Three specimens each about 50 mm×50 mm with 1.0 mm thickness were prepared. All samples were conditioned at about 23° C. and about 50% RH for a minimum of 24 hours prior to testing. For a sample that was newly etched or exposed to excessive moisture, it was dried in an air-circulating oven for two hours at about 105° C. prior to testing and conditioned at room temperature stated in the above.

An impedance material analyzer with a calibration-verification kit was used. The instrument was calibrated 24 hours within the measurement. The unit was set to sweep the target frequency±0.5% of the target. Sample thickness was measured and the sample was placed into the machine, making good contact with the fixture electrons but not touching the back wall of the fixture. The test was ran and the average permittivity and loss tangent over the narrow frequency range sweep were recorded.

Thermal Stress

The thermal stress of the copper clad laminates prepared herein was measured according to IPC-TM-650 2.4.13.1. For each clad side and test condition, three specimens were used for qualification testing and two specimens for lot acceptance testing. Each specimens was about 50.8 mm×50.8 mm by the thickness of the laminate. Half of the metallic clad laminate sampling was completely etched in accordance with standard industry practices.

The series of apparatus required to perform this test included an air circulating oven capable of maintaining a temperature of about 125° C., a thermostatically controlled electrically heated solder pot containing at least 1.0 kg of solder of about 288° C., a thermocouple or other device capable of measuring the solder temperature at a depth of 25.4 mm, a desiccation chamber capable of maintaining an atmosphere less than 30% RH at 23° C. and a series of optical magnification equipments.

The sample was first conditioned in the air-circulating oven for 4 to 6 hours and placed in a desiccators and allowed to cool to room temperature, subsequently fluxed with rosin flux and drained in a vertical position. The specimen was then float for about 10 seconds on the surface of a solder bath maintained at specified temperatures. The specimens were kept in intimate contact with the solder surface and agitated by gentle downward pressure using tongs or equivalent. The specimens were then cooled to room temperature. Evidence of charring, surface contamination, loss of surface resin, resin softening, delamination, blistering, weave exposure, propagation of imperfection, measling, crazing, voids, blistering, delamination (e.g., bumps) or other damages were recorded.

Flammability Test

The flammability of the copper clad laminates prepared herein was measured according to UL 94. The UL94 is a test which determines the material's burning characteristics after test specimens have been exposed to a specified test flame under controlled laboratory conditions. Twelve flame classifications were used to categories results, 6 of which relate to materials commonly used in manufacturing enclosures, structural parts and insulators found in consumer electronic products (5VA, 5VB, V-0, V-1, V-2, HB); 3 of which relate to low-density from materials commonly used in fabricating speaker grills and sound-deadening material (HF-1, HF-2, HBF); the final 3 relate to very thin films, generally not capable of supporting themselves in a horizontal position, usually found in substrates on printed circuit boards (VTM-0, VTM-1, VTM-2).

The test was conducted by placing test specimens molded from plastic materials orientated in either horizontal or vertical positions, and were subjected to a defined flame ignition source for a specified period of time. In a horizontal burning test, the result was the rate less than a specified maximum when the material was burned horizontally. In vertical burning, the result was the time taken for the material to self-extinguished after the ignition source was removed and the tendency of the specimen to ignite a cotton indicator located below the sample by dripping flaming particles.

Preparations of Examples 1-11

Example 1

Example 1 was prepared by mixing 100 grams of epoxy resin XU 19074, grams of phenolic novolac KPH-L2003, 0.5 grams of 2-methyl imidazole and 5 grams of PM glycol ether. The properties of Example 1 were measured according to IPC-TM-650 tests listed in Table 2. The test results are shown in Table 2.

TABLE 2

| Properties | | Testing Method | Result |
|---|---|---|---|
| Peel strength (1 oz) | | IPC-TM-650 2.4.8 | 6.1 lb/in |
| Decomposition temperature (Td), TGA | | IPC-TM-650 2.4.24.6 | 328° C. |
| Young's Modulus | | IPC-TM-650 2.4.18.3 | 23.0 GPa |
| Water absorption | | IPC-TM-650 2.6.2.1 | 0.18% |
| Volume resistivity | After moisture E-24/125 | IPC-TM-650 2.5.17.1 | $5 \times 10^8$ MΩ-cm $2 \times 10^7$ MΩ-cm |
| Surface resistivity | After moisture E-24/125 | IPC-TM-650 2.5.17.1 | $5 \times 10^7$ MΩ $4 \times 10^6$ MΩ |
| Dielectric constant (Dk) | 250 MHz | IPC-TM-650 2.5.5.2 IPC-TM-650 2.5.5.3 IPC-TM-650 2.5.5.9 | 4.60 |
| Thermal stress | 10 sec at 288° C. | IPC-TM-650 2.4.13.1 | 23 |
| | 10 sec at 320° C. | IPC-TM-650 2.4.13.1 Modified | 10 |
| Flammability testing | | UL94 | V0 |

Example 2

Example 2 was prepared by mixing 100 grams of epoxy resin XU 19074, grams of phenolic novolac KPH-L2003, about 15 grams to about 20 grams of talc powder AG609 (obtained from Specialty Minerals Inc., Bethlehem, Pa.), 0.5 grams of 2-methyl imidazole and 5 grams of PM glycol ether. The properties of Example 2 were measured according to IPC-TM-650 tests listed in Table 3. The test results are shown in Table 3.

TABLE 3

| Properties | | Testing Method | Result |
|---|---|---|---|
| Peel strength (1 oz) | | IPC-TM-650 2.4.8 | 6.4 lb/in |
| Decomposition temperature (Td), TGA | | IPC-TM-650 2.4.24.6 | 335° C. |
| Young's Modulus | | IPC-TM-650 2.4.18.3 | 21.8 GPa |
| Water absorption | | IPC-TM-650 2.6.2.1 | 0.19% |
| Volume resistivity | After moisture E-24/125 | IPC-TM-650 2.5.17.1 | $6 \times 10^8$ MΩ-cm $3 \times 10^7$ MΩ-cm |
| Surface resistivity | After moisture E-24/125 | IPC-TM-650 2.5.17.1 | $5 \times 10^7$ MΩ $4 \times 10^6$ MΩ |
| Dielectric constant (Dk) | 250 MHz | IPC-TM-650 2.5.5.2 IPC-TM-650 2.5.5.3 IPC-TM-650 2.5.5.9 | 4.82 |
| Thermal stress | 10 sec at 288° C. | IPC-TM-650 2.4.13.1 | 30 |
| | 10 sec at 320° C. | IPC-TM-650 2.4.13.1 Modified | 15 |
| Flammability testing | | UL94 | V0 |

Example 3

Example 3 was prepared by mixing 100 grams of epoxy resin XU 19074, grams of phenolic novolac KPH-L2003, about 15 grams to about 20 grams of a mixture of talc powder AG609 and silica 1250, 0.5 grams of 2-methyl imidazole and 5 grams of PM glycol ether. The properties of Example 3 were measured according to IPC-TM-650 tests listed in Table 4. The test results are shown in Table 4.

TABLE 4

| Properties | | Testing Method | Result |
|---|---|---|---|
| Peel strength (1 oz) | | IPC-TM-650 2.4.8 | 6.8 lb/in |
| Decomposition temperature (Td), TGA | | IPC-TM-650 2.4.24.6 | 336° C. |
| Young's Modulus | | IPC-TM-650 2.4.18.3 | 21.7 GPa |
| Water absorption | | IPC-TM-650 2.6.2.1 | 0.18% |
| Volume resistivity | After moisture E-24/125 | IPC-TM-650 2.5.17.1 | $8 \times 10^8$ MΩ-cm $6.5 \times 10^7$ MΩ-cm |
| Surface resistivity | After moisture E-24/125 | IPC-TM-650 2.5.17.1 | $6 \times 10^7$ MΩ $7 \times 10^6$ MΩ |
| Dielectric constant (Dk) | 250 MHz | IPC-TM-650 2.5.5.2 IPC-TM-650 2.5.5.3 IPC-TM-650 2.5.5.9 | 4.71 |
| Thermal stress | 10 sec at 288° C. | IPC-TM-650 2.4.13.1 | 30 |
| | 10 sec at 320° C. | IPC-TM-650 2.4.13.1 Modified | 16 |
| Flammability testing | | UL94 | V0 |

Example 4

Example 4 was prepared by mixing 100 grams of epoxy resin XU 19074, grams of phenolic novolac KPH-L2003, about 15 grams to about 20 grams of crystalline silica SQ-05 (obtained from Sibelco Shanghai Minerals Trading Co., Ltd., Shanghai, China), 0.5 grams of 2-methyl imidazole and 5 grams of PM glycol ether. The properties of Example 4 were measured according to IPC-TM-650 tests listed in Table 5. The test results are shown in Table 5.

TABLE 5

| Properties | | Testing Method | Result |
|---|---|---|---|
| Peel strength (1 oz) | | IPC-TM-650 2.4.8 | 7.5 lb/in |
| Decomposition temperature (Td), TGA | | IPC-TM-650 2.4.24.6 | 340° C. |
| Young's Modulus | | IPC-TM-650 2.4.18.3 | 21.5 GPa |
| Water absorption | | IPC-TM-650 2.6.2.1 | 0.17% |
| Volume resistivity | After moisture E-24/125 | IPC-TM-650 2.5.17.1 | $7 \times 10^8$ MΩ-cm $9 \times 10^7$ MΩ-cm |
| Surface resistivity | After moisture E-24/125 | IPC-TM-650 2.5.17.1 | $6 \times 10^7$ MΩ $3 \times 10^6$ MΩ |
| Dielectric constant (Dk) | 250 MHz | IPC-TM-650 2.5.5.2 IPC-TM-650 2.5.5.3 IPC-TM-650 2.5.5.9 | 4.74 |
| Thermal stress | 10 sec at 288° C. | IPC-TM-650 2.4.13.1 | 30 |
| | 10 sec at 320° C. | IPC-TM-650 2.4.13.1 Modified | 18 |
| Flammability testing | | UL94 | V0 |

Example 5

Example 5 was prepared by mixing 100 grams of epoxy resin XU 19074, grams of phenolic novolac KPH-L2003, about 15 grams to about 20 grams of fused silica 525 (obtained from Sibelco Shanghai Minerals Trading Co., Ltd., Shanghai, China), 0.5 grams of 2-methyl imidazole and 5 grams of PM glycol ether. The properties of Example 5 were measured according to IPC-TM-650 tests listed in Table 6. The test results are shown in Table 6.

TABLE 6

| Properties | | Testing Method | Result |
|---|---|---|---|
| Peel strength (1 oz) | | IPC-TM-650 2.4.8 | 8.5 lb/in |
| Decomposition temperature (Td), TGA | | IPC-TM-650 2.4.24.6 | 340° C. |
| Young's Modulus | | IPC-TM-650 2.4.18.3 | 21.4 GPa |
| Water absorption | | IPC-TM-650 2.6.2.1 | 0.17% |
| Volume resistivity | After moisture E-24/125 | IPC-TM-650 2.5.17.1 | $7 \times 10^8$ MΩ-cm $6 \times 10^7$ MΩ-cm |
| Surface resistivity | After moisture E-24/125 | IPC-TM-650 2.5.17.1 | $5 \times 10^7$ MΩ $6 \times 10^6$ MΩ |
| Dielectric constant (Dk) | 250 MHz | IPC-TM-650 2.5.5.2 IPC-TM-650 2.5.5.3 IPC-TM-650 2.5.5.9 | 4.75 |
| Thermal stress | 10 sec at 288° C. | IPC-TM-650 2.4.13.1 | 30 |
| | 10 sec at 320° C. | IPC-TM-650 2.4.13.1 Modified | 17 |
| Flammability testing | | UL94 | V0 |

Example 6

Example 6 was prepared by mixing 100 grams of epoxy resin XU 19074, grams of phenolic novolac KPH-L2003, about 15 grams to about 20 grams of a-quartz silica M3000 (obtained from Sibelco Shanghai Minerals Trading Co., Ltd., Shanghai, China), 0.5 grams of 2-methyl imidazole and 5 grams of PM glycol ether. The properties of Example 6 were measured according to IPC-TM-650 tests listed in Table 7. The test results are shown in Table 7.

TABLE 7

| Properties | | Testing Method | Result |
|---|---|---|---|
| Peel strength (1 oz) | | IPC-TM-650 2.4.8 | 7.8 lb/in |
| Decomposition temperature (Td), TGA | | IPC-TM-650 2.4.24.6 | 342° C. |
| Young's Modulus | | IPC-TM-650 2.4.18.3 | 21.7 GPa |
| Water absorption | | IPC-TM-650 2.6.2.1 | 0.19% |
| Volume resistivity | After moisture E-24/125 | IPC-TM-650 2.5.17.1 | $8 \times 10^8$ MΩ-cm $6 \times 10^7$ MΩ-cm |
| Surface resistivity | After moisture E-24/125 | IPC-TM-650 2.5.17.1 | $7 \times 10^7$ MΩ $5 \times 10^6$ MΩ |
| Dielectric constant (Dk) | 250 MHz | IPC-TM-650 2.5.5.2 IPC-TM-650 2.5.5.3 IPC-TM-650 2.5.5.9 | 4.72 |
| Thermal stress | 10 sec at 288° C. | IPC-TM-650 2.4.13.1 | 30+ |
| | 10 sec at 320° C. | IPC-TM-650 2.4.13.1 Modified | 18 |
| Flammability testing | | UL94 | V0 |

Example 7

Example 7 was prepared by mixing 100 grams of epoxy resin XU 19074, grams of phenolic novolac KPH-L2003, 12.5 grams of ultra-fine silica 1250 (obtained from Shanghai Huijing Sub-Nanoseale New Material Co., Ltd.), 0.5 grams of 2-methyl imidazole and 5 grams of PM glycol ether. The properties of Example 7 were measured according to IPC-TM-650 tests listed in Table 8. The test results are shown in Table 8.

TABLE 8

| Properties | | Testing Method | Result |
|---|---|---|---|
| Peel strength (1 oz) | | IPC-TM-650 2.4.8 | 10.6 lb/in |
| Decomposition temperature (Td), TGA | | IPC-TM-650 2.4.24.6 | 345° C. |
| Young's Modulus | | IPC-TM-650 2.4.18.3 | 21.3 GPa |
| Water absorption | | IPC-TM-650 2.6.2.1 | 0.19% |
| Volume resistivity | After moisture E-24/125 | IPC-TM-650 2.5.17.1 | $9 \times 10^8$ MΩ-cm $8 \times 10^7$ MΩ-cm |
| Surface resistivity | After moisture E-24/125 | IPC-TM-650 2.5.17.1 | $8 \times 10^7$ MΩ $6 \times 10^6$ MΩ |
| Dielectric constant (Dk) | 250 MHz | IPC-TM-650 2.5.5.2 IPC-TM-650 2.5.5.3 IPC-TM-650 2.5.5.9 | 4.70 |
| Thermal stress | 10 sec at 288° C. | IPC-TM-650 2.4.13.1 | 30 |
| | 10 sec at 320° C. | IPC-TM-650 2.4.13.1 Modified | 22 |
| Flammability testing | | UL94 | V0 |

Example 8

Example 8 was prepared by mixing 100 grams of epoxy resin XU 19074, grams of phenolic novolac KPH-L2003, 16 grams of ultra-fine silica 1250, 0.5 grams of 2-methyl imidazole and 5 grams of PM glycol ether. The properties of Example 8 were measured according to IPC-TM-650 tests listed in Table 9. The test results are shown in Table 9.

TABLE 9

| Properties | | Testing Method | Result |
| --- | --- | --- | --- |
| Peel strength (1 oz) | | IPC-TM-650 2.4.8 | 10.9 lb/in |
| Decomposition temperature (Td), TGA | | IPC-TM-650 2.4.24.6 | 343° C. |
| Young's Modulus | | IPC-TM-650 2.4.18.3 | 21.1 GPa |
| Water absorption | | IPC-TM-650 2.6.2.1 | 0.18% |
| Volume resistivity | After moisture E-24/125 | IPC-TM-650 2.5.17.1 | $9 \times 10^8$ MΩ-cm<br>$8 \times 10^7$ MΩ-cm |
| Surface resistivity | After moisture E-24/125 | IPC-TM-650 2.5.17.1 | $8 \times 10^7$ MΩ<br>$7 \times 10^6$ MΩ |
| Dielectric constant (Dk) | 250 MHz | IPC-TM-650 2.5.5.2<br>IPC-TM-650 2.5.5.3<br>IPC-TM-650 2.5.5.9 | 4.71 |
| Thermal stress | 10 sec at 288° C. | IPC-TM-650 2.4.13.1 | 30 |
| | 10 sec at 320° C. | IPC-TM-650 2.4.13.1 Modified | 21 |
| Flammability testing | | UL94 | V0 |

Example 9

Example 9 was prepared by mixing 100 grams of epoxy resin XU 19074, grams of phenolic novolac KPH-L2003, 20 grams of ultra-fine silica 1250, 0.5 grams of 2-methyl imidazole and 5 grams of PM glycol ether. The properties of Example 9 were measured according to IPC-TM-650 tests listed in Table 10. The test results are shown in Table 10.

TABLE 10

| Properties | | Testing Method | Result |
| --- | --- | --- | --- |
| Peel strength (1 oz) | | IPC-TM-650 2.4.8 | 10.8 lb/in |
| Decomposition temperature (Td), TGA | | IPC-TM-650 2.4.24.6 | 346° C. |
| Young's Modulus | | IPC-TM-650 2.4.18.3 | 21.0 GPa |
| Water absorption | | IPC-TM-650 2.6.2.1 | 0.17% |
| Volume resistivity | After moisture E-24/125 | IPC-TM-650 2.5.17.1 | $8 \times 10^8$ MΩ-cm<br>$7 \times 10^7$ MΩ-cm |
| Surface resistivity | After moisture E-24/125 | IPC-TM-650 2.5.17.1 | $9 \times 10^7$ MΩ<br>$6 \times 10^6$ MΩ |
| Dielectric constant (Dk) | 250 MHz | IPC-TM-650 2.5.5.2<br>IPC-TM-650 2.5.5.3<br>IPC-TM-650 2.5.5.9 | 4.73 |
| Thermal stress | 10 sec at 288° C. | IPC-TM-650 2.4.13.1 | 30 |
| | 10 sec at 320° C. | IPC-TM-650 2.4.13.1 Modified | 24 |
| Flammability testing | | UL94 | V0 |

Example 10

Example 10 was prepared by mixing 100 grams of epoxy resin XU 19074, grams of phenolic novolac KPH-L2003, about 15 grams to about 20 grams of microsphere silica 0250 (obtained from Sibelco Shanghai Minerals Trading Co., Ltd., Shanghai, China), 0.5 grams of 2-methyl imidazole and 5 grams of PM glycol ether. The properties of Example 10 were measured according to IPC-TM-650 tests listed in Table 11. The test results are shown in Table 11.

TABLE 11

| Properties | | Testing Method | Result |
| --- | --- | --- | --- |
| Peel strength (1 oz) | | IPC-TM-650 2.4.8 | 7.5 lb/in |
| Decomposition temperature (Td), TGA | | IPC-TM-650 2.4.24.6 | 341° C. |
| Young's Modulus | | IPC-TM-650 2.4.18.3 | 21.6 GPa |
| Water absorption | | IPC-TM-650 2.6.2.1 | 0.19% |
| Volume resistivity | After moisture E-24/125 | IPC-TM-650 2.5.17.1 | $7 \times 10^8$ MΩ-cm<br>$5 \times 10^6$ MΩ-cm |

TABLE 11-continued

| Properties | Testing Method | | Result |
|---|---|---|---|
| Surface resistivity | After moisture E-24/125 | IPC-TM-650 2.5.17.1 | $6 \times 10^7$ MΩ $5 \times 10^6$ MΩ |
| Dielectric constant (Dk) | 250 MHz | IPC-TM-650 2.5.5.2 IPC-TM-650 2.5.5.3 IPC-TM-650 2.5.5.9 | 4.77 |
| Thermal stress | 10 sec at 288° C. 10 sec at 320° C. | IPC-TM-650 2.4.13.1 IPC-TM-650 2.4.13.1 Modified | 30 16 |
| Flammability testing | | UL94 | V0 |

Example 11

Example 11 was prepared by mixing 100 grams of epoxy resin XU 19074, grams of phenolic novolac KPH-L2003, about 15 grams to about 20 grams of active silica powder SG11 (obtained from Sibelco Shanghai Minerals Trading Co., Ltd., Shanghai, China), 0.5 grams of 2-methyl imidazole and 5 grams of PM glycol ether. The properties of Example 11 were measured according to IPC-TM-650 tests listed in Table 12. The test results are shown in Table 12.

TABLE 12

| Properties | Testing Method | | Result |
|---|---|---|---|
| Peel strength (1 oz) | | IPC-TM-650 2.4.8 | 8.4 lb/in |
| Decomposition temperature (Td), TGA | | IPC-TM-650 2.4.24.6 | 338° C. |
| Young's Modulus | | IPC-TM-650 2.4.18.3 | 21.6 GPa |
| Water absorption | | IPC-TM-650 2.6.2.1 | 0.19% |
| Volume resistivity | After moisture E-24/125 | IPC-TM-650 2.5.17.1 | $6 \times 10^8$ MΩ-cm $3 \times 10^7$ MΩ-cm |
| Surface resistivity | After moisture E-24/125 | IPC-TM-650 2.5.17.1 | $8 \times 10^7$ MΩ $5 \times 10^6$ MΩ |
| Dielectric constant (Dk) | 250 MHz | IPC-TM-650 2.5.5.2 IPC-TM-650 2.5.5.3 IPC-TM-650 2.5.5.9 | 4.6 |
| Thermal stress | 10 sec at 288° C. 10 sec at 320° C. | IPC-TM-650 2.4.13.1 IPC-TM-650 2.4.13.1 Modified | 30 15 |
| Flammability testing | | UL94 | V0 |

The data above show that Examples 3-11 which comprise silica fillers provide higher peel strength than Example 2 which comprises talc.

Table 13 shows the average particle size, dielectric constant, loss tangent, electrical resistivity and electric field strength of silica, aluminum hydroxide, talc powder, mica powder, kaolin and clay.

TABLE 13

| Inorganic fillers | Average particle size | Dielectric constant (Dk) | Loss tangent | Electrical Resistivity | Electric Field Strength |
|---|---|---|---|---|---|
| Silica | 10 μm | 3.5-3.8 | $5 \times 10^{-4}$-$15 \times 10^{-4}$ | $3.2 \times 10^{15}$ Ωcm | / |
| Aluminum hydroxide | 10 μm | 7 | $2 \times 10^{-4}$-$40 \times 10^{-4}$ | / | 25.6 kV/cm |
| Talc powder | 10 μm | 7.5 | / | / | / |
| Mica powder | 10 μm | 7.5 | / | / | / |
| Kaolin/clay | 10 μm | 7.5 | / | / | / |

The average particle size of the fillers used herein range from about 0.05 μm to about 20 μm. Where the average particle size of the filler is greater than 20 μm, there is a decrease in electrical resistivity of the laminates formed with an epoxy resin composition comprising such filler. Where the average particle size of the filler is smaller than 0.05 μm, the viscosity of the epoxy resin composition may be too high for processing.

Preparations of Examples 12-13 and Comparative Examples A-E

Example 12

Example 12 was prepared by mixing 100 grams of epoxy resin XU 19074, grams of phenolic novolac KPH-L2003, 18 grams of a mixture of inorganic fillers (including 4 grams of talc powder, 4 grams of silica, 3 grams of aluminium hydroxide, 3 grams of mica, 2 grams of kaolin and 2 grams of clay), 3 grams of Dow Corning Z-6040, 0.5 grams of 2-methyl imidazole and 15 grams of ethylene glycol.

Example 13

Example 13 was prepared by mixing 100 grams of epoxy resin XU 19074, grams of phenolic novolac KPH-L2003, 18 grams of a mixture of inorganic fillers (including 3 grams of talc powder, 4 grams of silica, 4 grams of aluminium hydroxide, 3 grams of mica, 2 grams of kaolin and 2 grams of clay), 3 grams of Dow Corning Z-6040, 0.5 grams of 2-methyl imidazole and 15 grams of ethylene glycol.

Comparative Example A

Comparative Example A was prepared by mixing 100 grams of epoxy resin XU 19074, 30 grams of phenolic novolac KPH-L2003, 18 grams of talc powder, 3 grams of Dow Corning Z-6040, 0.5 grams of 2-methyl imidazole and 15 grams of ethylene glycol.

Comparative Example B

Comparative Example B was prepared by mixing 100 grams of epoxy resin XU 19074, 30 grams of phenolic novolac KPH-L2003, 18 grams of silica, 3 grams of Dow Corning Z-6040, 0.5 grams of 2-methyl imidazole and 15 grams of ethylene glycol.

Comparative Example C

Comparative Example C was prepared by mixing 100 grams of epoxy resin XU 19074, 30 grams of phenolic novolac KPH-L2003, 18 grams of aluminium hydroxide, 3 grams of Dow Corning Z-6040, 0.5 grams of 2-methyl imidazole and 15 grams of ethylene glycol.

Comparative Example D

Comparative Example D was prepared by mixing 100 grams of epoxy resin XU 19074, 30 grams of phenolic novolac KPH-L2003, 18 grams of mica, 3 grams of Dow Corning Z-6040, 0.5 grams of 2-methyl imidazole and 15 grams of ethylene glycol.

Comparative Example E

Comparative Example E was prepared by mixing 100 grams of epoxy resin XU 19074, 30 grams of phenolic novolac KPH-L2003, 18 grams of kaolin (or clay), 3 grams of Dow Corning Z-6040, 0.5 grams of 2-methyl imidazole and 15 grams of ethylene glycol.

The properties of Example 13 and Comparative Examples A-E were measured according to IPC-TM-650 tests listed in Table 14. The test results are shown in Table 14 below.

The data above show that Comparative Example B which comprises a silica filler provide higher peel strength than Comparative Example A which comprises talc.

Preparations of Examples 14-18
Example 14

Example 14 was prepared by mixing 60 parts of XZ 92754.00 (an epoxy resin obtained from the Dow Chemical Company, Midland, Mich.), 5 parts of EPON™ Resin 1031 (an epoxy resin obtained from flexion Specialty Chemicals, Inc., Shanghai, China), 35 parts of XZ 92763.00 (a phenolic novolac obtained from the Dow Chemical Company, Midland, Mich.), 0.068 parts of 2PZ (i.e., 2-phenylimidazole, a catalyst obtained from Shikoku OM (Shanghai) Co., Ltd., Shanghai, China.) and 2 parts of DOWANOL™ PMA (a propylene glycol methyl ether acetate solvent obtained from the Dow Chemical Company, Midland, Mich.).

Example 15

Example 15 was prepared by mixing 60 parts of XZ 92754.00, 5 parts of EPON™ Resin 1031, 35 parts of XZ 92763.00, 4 parts of FS2500 (a talc obtained from Shanghai Shuosi French White Co., Ltd., Shanghai, China), 0.033 parts of Z-6040 silane, 0.067 parts of 2-phenylimidazole and 4 parts of DOWANOL™ PMA.

Example 16

Example 16 was prepared by mixing 60 parts of XZ 92754.00, 5 parts of EPON™ Resin 1031, 35 parts of XZ 92763.00, 4 parts of SilverBond 925 (a silica commercially available from Bao-Lin Industrial Co., Taiwan), 0.033 parts of Z-6040 silane, 0.067 parts of 2-phenylimidazole and 4 parts of DOWANOL™ PMA.

Example 17

Example 17 was prepared by mixing 60 parts of XZ 92754.00, 5 parts of EPON™ Resin 1031, 35 parts of XZ 92763.00, 9 parts of FS2500, 0.075 parts of Z-6040 silane, 0.067 parts of 2-phenylimidazole and 6 parts of DOWANOL™ PMA.

Example 18

Example 18 was prepared by mixing 60 parts of XZ 92754.00, 5 parts of EPON™ Resin 1031, 35 parts of XZ 92763.00, 9 parts of 925, 0.075 parts of Z-6040 silane, 0.067 parts of 2-phenylimidazole and 6 parts of DOWANOL™ PMA.

The properties of Examples 14-18 were measured according to IPC-TM-650 tests and thermomechanical analysis listed in Table 15. The test results are shown in Table 15.

TABLE 14

| Properties | | Ex. 12 | Comp. Ex. A | Comp. Ex. B | Comp. Ex. C | Comp. Ex. D | Comp. Ex. E |
|---|---|---|---|---|---|---|---|
| Peel Strength (1 oz) | | 8.6 lb/in | 7.5 lb/in | 8.2 lb/in | 8.3 lb/in | 8.4 lb/in | 8.2 lb/in |
| Decomposition temp. (Td), TGA | | 350° C. | 330° C. | 332° C. | 320° C. | 334° C. | 332° C. |
| Young's Modulus | | 20 GPa | 21.5 GPa | 21.8 GPa | 22.0 GPa | 21.5 GPa | 21.5 GPa |
| Impact strength | | 160 kJ/m$^2$ | 150 kJ/m$^2$ | 152 kJ/m$^2$ | 152 kJ/m$^2$ | 150 kJ/m$^2$ | 150 kJ/m$^2$ |
| Water absorption | | 0.16% | 0.18% | 0.19% | 0.17% | 0.17% | 0.19% |
| Volume resistively | After moisture | $8 \times 10^8$ MΩ | $5 \times 10^8$ MΩ | $5 \times 10^8$ MΩ | $6 \times 10^8$ MΩ | $5 \times 10^7$ MΩ | $5 \times 10^8$ MΩ |
| | E-24/125 | $8 \times 10^6$ MΩ | $5 \times 10^6$ MΩ | $5 \times 10^6$ MΩ | $6 \times 10^6$ MΩ | $5 \times 10^5$ MΩ | $5 \times 10^6$ MΩ |
| Surface resistively | After moisture | $8 \times 10^7$ MΩ | $5 \times 10^7$ MΩ | $5 \times 10^7$ MΩ | $6 \times 10^7$ MΩ | $5 \times 10^6$ MΩ | $5 \times 10^7$ MΩ |
| | E-24/125 | $8 \times 10^6$ MΩ | $5 \times 10^6$ MΩ | $5 \times 10^6$ MΩ | $6 \times 10^6$ MΩ | $5 \times 10^5$ MΩ | $5 \times 10^6$ MΩ |
| Dielectric constant (Dk) | 250 MHz | 4.48 | 4.60 | 4.61 | 4.61 | 4.6 | 5.2 |
| Thermal Stress | 10 sec at 288° C. | 420 sec | 230 sec | 229 sec | 212 sec | 227 sec | 220 |
| | 10 sec at 320° C. | 220 sec | 100 sec | 98 sec | 89 sec | 95 sec | 90 |
| Drill hole roughness | | 20 μm | 30 μm | 35 μm | 32 μm | 32 μm | 33 μm |
| Flammability testing | | V0 | V0 | V0 | V0 | V0 | V0 |

TABLE 15

| Properties | | Testing Method | Ex. 14 | Ex. 15 | Ex. 16 | Ex. 17 | Ex. 18 |
|---|---|---|---|---|---|---|---|
| Copper Foil Peel strength (1 oz) | | IPC-TM-650 2.4.8 | 1 oz 8.3 lb/in | 1 oz 7.59 lb/in | 1 oz 8.21 lb/in | 1 oz 6.94 lb/in | 1 oz 8.1 lb/in |
| Z-axis C.T.E | Before Tg | Thermo-mechanical analysis | 62.5 ppm/° C. | 55.6 ppm/° C. | 54.8 ppm/° C. | 53.3 ppm/° C. | 52.6 ppm/° C. |
| | After Tg | | 273 ppm/° C. | 265 ppm/° C. | 258 ppm/° C. | 197 ppm/° C. | 504 ppm/° C. |
| | Total | | 3.431% | 3.085% | 2.947% | 2.896% | 2.784% |
| Flexural Strength | Wrap Fill | IPC-TM-650 2.4.4 | 70648 psi 67979 psi | 65808 psi 56161 psi | 67545 psi 57155 psi | 61842 psi 53840 psi | 63106 psi 55140 psi |

While the invention has been described with respect to a limited number of embodiments, the specific features of one embodiment should not be attributed to other embodiments of the invention. No single embodiment is representative of all aspects of the claimed subject matter. In some embodiments, the compositions or methods may include numerous compounds or steps not mentioned herein. In other embodiments, the compositions or methods do not include, or are substantially substantially free of or free of, any compounds or steps not enumerated herein. Variations and modifications from the described embodiments exist. It is noted that the methods disclosed herein are described with reference to a number of steps. These steps can be practiced in any sequence. One or more steps may be omitted or combined but still achieve substantially the same results. The appended claims intend to cover all such variations and modifications as falling within the scope of the invention.

All publications and patent applications mentioned in this specification are herein incorporated by reference to the same extent as if each individual publication or patent application was specifically and individually indicated to be incorporated by reference. Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. An epoxy resin varnish for making a laminate comprising:
    (a) an epoxy resin;
    (b) a curing agent;
    (c) a coupling agent;
    (d) a catalyst;
    (e) an inorganic filler; and
    (f) a solvent,
wherein the amount of the inorganic filler is from about 12.5 parts to 20 parts by weight, based on 100 parts by weight of the epoxy resin, wherein the amount of the curing agent is from 15 parts to about 35 parts by weight, based on 100 parts by weight of the epoxy resin, and wherein the inorganic filler has a water content of less than about 2 wt. %; and
wherein the epoxy resin varnish contains no other inorganic fillers.

2. The epoxy resin varnish of claim 1, wherein the epoxy resin comprises the following diepoxy compound:

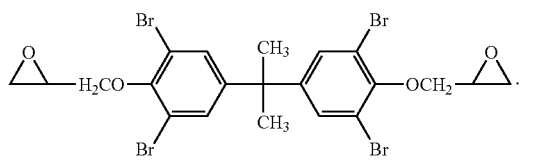

3. The epoxy resin varnish of claim 1, wherein the curing agent comprises a phenolic novolac.

4. The epoxy resin varnish of claim 1, wherein the coupling agent comprises the following silylated epoxy compound:

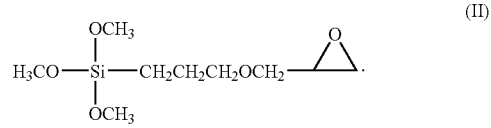

5. The epoxy resin varnish of claim 1, wherein the amount of the coupling agent is from about 0.2 parts to about 0.5 parts by weight, the amount of the catalyst is from about 0.005 parts to about 0.01 parts by weight, the amount of the solvent is from about 10 parts to about 30 parts by weight, and the amounts are based on 100 parts by weight of the epoxy resin.

6. The epoxy resin varnish of claim 1, wherein the average particle size of the inorganic filler is from about 0.5 microns to about 20 microns.

7. The epoxy resin varnish of claim 1, wherein the inorganic filler includes talc, silica, aluminum hydroxide, mica, kaolin, aluminum silicate, or clay.

8. The epoxy resin varnish of claim 1, wherein the inorganic filler includes a silica selected from crystalline silica, fumed silica, fused silica, and silica gel.

9. The epoxy resin varnish of claim 8, wherein the silica has a water content of less than about 1 wt. %.

10. The epoxy resin varnish of claim 9, wherein the silica has a purity of greater than about 99.5%.

11. The epoxy resin varnish of claim 10, wherein the silica has an average particle size from about 0.5 microns to about 20 microns.

12. A prepreg comprising a partially cured epoxy resin composition comprising an epoxy resin, a curing agent, a coupling agent, a catalyst, and an inorganic filler,
    wherein the amount of the inorganic filler is from about 12.5 parts to 20 parts by weight, based on 100 parts by weight of the epoxy resin;
    wherein the amount of the curing agent is from 15 parts to about 35 parts by weight, based on 100 parts by weight of the epoxy resin;

wherein the inorganic filler has a water content of less than about 2 wt. %; and wherein the partially cured epoxy resin composition contains no other inorganic fillers.

13. The prepreg of claim 12 further comprising a substrate embedded in the partially cured epoxy resin composition.

14. The prepreg of claim 13, wherein the substrate comprises one or more epoxy glass fiber cloths.

15. The prepreg of claim 12, wherein the inorganic filler includes talc, silica, aluminum hydroxide, mica, kaolin, aluminum silicate, or clay.

16. The prepreg of claim 12, wherein the inorganic filler includes a silica having a water content of less than about 1 wt. %, a purity of greater than about 99.5% and an average particle size from about 0.05 microns to about 20 microns.

* * * * *

UNITED STATES PATENT AND TRADEMARK OFFICE
CERTIFICATE OF CORRECTION

PATENT NO. : 9,169,346 B2
APPLICATION NO. : 12/337651
DATED : October 27, 2015
INVENTOR(S) : Chien-Jen Chung and Zhuo Wang Page 1 of 1

It is certified that error appears in the above-identified patent and that said Letters Patent is hereby corrected as shown below:

Title Page, Item (57), line 6 delete "In farther embodiments," and substitute therefore --In further embodiments,--.

Signed and Sealed this
Twelfth Day of July, 2016

Michelle K. Lee
*Director of the United States Patent and Trademark Office*